United States Patent
Cheng

(10) Patent No.: US 7,759,776 B2
(45) Date of Patent: Jul. 20, 2010

(54) SPACE TRANSFORMER HAVING MULTI-LAYER PAD STRUCTURES

(75) Inventor: Hsu Ming Cheng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 719 days.

(21) Appl. No.: 11/392,299

(22) Filed: Mar. 28, 2006

(65) Prior Publication Data

US 2007/0235873 A1    Oct. 11, 2007

(51) Int. Cl.
*H01L 23/48* (2006.01)
*H01L 23/52* (2006.01)
*H01L 29/40* (2006.01)

(52) U.S. Cl. .............. 257/668; 257/E23.114; 257/E23.08; 257/E23.02; 257/E21.476; 257/E21.508; 257/659; 257/738; 257/734; 257/737; 257/778; 257/774; 257/779; 257/772; 257/762; 257/780; 324/754; 336/223; 336/200

(58) Field of Classification Search .............. 257/738, 257/737, 778, 780, 758, 774, 773, E21.476, 257/762, E23.02, E23.06, E21.508, 668, 257/734, 779, 772, 728, 659, E23.114, E23.08; 324/754; 336/223, 200
See application file for complete search history.

(56) References Cited

U.S. PATENT DOCUMENTS

| | | | |
|---|---|---|---|
| 4,845,543 A | 7/1989 | Okikawa et al. | |
| 5,124,175 A * | 6/1992 | Miracky et al. | 216/13 |
| 5,431,328 A | 7/1995 | Chang et al. | |
| 5,436,412 A * | 7/1995 | Ahmad et al. | 174/265 |
| 5,756,021 A * | 5/1998 | Hedrick et al. | 264/45.1 |
| 6,671,947 B2 * | 1/2004 | Bohr | 29/846 |
| 6,794,680 B2 | 9/2004 | Kimura et al. | |
| 7,292,055 B2 * | 11/2007 | Egitto et al. | 324/754 |
| 2001/0013423 A1* | 8/2001 | Dalal et al. | 174/260 |
| 2005/0001324 A1* | 1/2005 | Dunn et al. | 257/762 |
| 2005/0242446 A1 | 11/2005 | Jin | |
| 2007/0026631 A1* | 2/2007 | Lin et al. | 438/424 |
| 2008/0020566 A1* | 1/2008 | Egitto et al. | 438/637 |
| 2008/0108221 A1* | 5/2008 | Kim et al. | 438/652 |

* cited by examiner

*Primary Examiner*—Alexander O Williams
(74) *Attorney, Agent, or Firm*—Duane Morris LLP

(57) ABSTRACT

Pad structures and methods for forming such pad structures are provided. For the pad structure, the first conductive material layer has a first hardness over about 200 kg/mm². The second conductive material layer is over the first conductive material layer and has a second hardness over about 80 kg/mm². For the method of forming the pad structure, a plurality of first conductive material layers is formed within each of a plurality of openings of a substrate. The substrate has a plurality of openings therein. The first conductive material layers are formed within each of the openings of the substrate. The first conductive material layers substantially have a round top surface. The second conductive material layers are formed and substantially conformal over the first conductive material layers. The second conductive material layers cover a major portion of the round top surface of the first conductive material layers.

16 Claims, 3 Drawing Sheets

SPACE TRANSFORMER HAVING MULTI-LAYER PAD STRUCTURES

BACKGROUND OF THE INVENTION

1. Field of the Invention

The present invention relates to pad structures of space transformers and methods thereof.

2. Description of the Related Art

With the advance of electronic products, semiconductor technology has been widely applied in manufacturing memories, central processing units (CPUs), liquid crystal displays (LCDs), light emitting diodes (LEDs), laser diodes and other integrated devices or circuits. Due to high-integration of chips, dimensions of semiconductor devices have been reduced, and various package structures and methods have been proposed. Test apparatus must also be designed, in order to test these package structures.

FIG. 1 is a schematic cross-sectional view of a probe card attached to a test apparatus.

Referring to FIG. 1, the test apparatus comprises the printed circuit board (PCB) 100, the iron frame 110, the space transformer 120, the upper die 130, the cobra head 140 and the lower die 150. The space transformer 120 is attached to the PCB 100 through a ball-grid array (BGA) or a pin-grid array (PGA). The surface 125 of the space transformer 120 is attached to the guide plate 130. The pins (not shown) of the guide plate 130 contact pad structures (not shown) at the surface 125 of the space transformer 120. The cobra head 140 and the lower die 150 are then sequentially attached to the guide plate 130. Because tests of chips require various space transformers corresponding thereto, the guide plate 130 and the space transformer 120 are disassembled from the test apparatus to change a desired space transformer.

FIG. 2 is a cross-sectional view of a prior art space transformer.

The space transformer 120 comprises a plurality of pad structures 120a therein. The pad structures 120a are made of copper. While being assembled with the space transformer 120, the pins 105 of the guide plate 130 move upward to contact with the pad structures 120a of the space transformer 120. Due to the softness of copper, the pins 105 usually penetrate into the pad structures 120a of the space transformer 120. After making contact several times, the pins 105 may penetrate through the pad structures 120a of the space transformer 120 and touch the matrix of the space transformer 120. This phenomenon results in contamination at the tips of the pins 105 or creates particles. In some worst-case scenarios, a misalignment exists between the guide plate 130 and the space transformer 120. The pins 105 of the guide plate 130 touches the corners 115 of the space transformer 120, which are not made of metallic materials. This phenomenon also causes contamination and particles during the assembly of the guide plate 130 and the space transformer 120.

U.S. Pat. No. 6,794,680 describes a semiconductor device. The semiconductor device has a pad, a first conductor and a second conductor, which are arranged at a surface of the pad. The first conductor has hardness that is greater than that of the second conductor and not less than that of a probe stylus. The first conductor is arranged at the surface of the pad such that the probe stylus hits or rubs against the first conductor at least one time while the probe stylus is in contact with and sliding on the surface of the pad.

U.S. Patent Application No. 2005/0242446 provides a manufacturing method for an integrated circuit package. In such a method, a contact pad is formed under a passivation layer on an integrated circuit. An opening is formed in the passivation layer exposing the contact pad. An "under bump metallurgy" is formed over the contact pad and the passivation layer. The method further includes forming a bump pad over the "under bump metallurgy" of a material having a first hardness and forming a bump on and over the bump pad. The bump has a top flat surface and of a material having a second hardness softer than the first hardness.

Improved pad structures of the space transformer and methods of forming pad structures are desired.

SUMMARY OF THE INVENTION

In accordance with some exemplary embodiments, a pad structure comprises a first conductive material layer and a second conductive material layer. The first conductive material layer has a first hardness over about 200 kg/mm$^2$. The second conductive material layer is over the first conductive material layer with a second hardness over about 80 kg/mm$^2$.

In accordance with some exemplary embodiments, a space transformer (ST) substrate comprises a substrate, a plurality of first conductive material layers and a plurality of second conductive material layers. The substrate has a plurality of openings therein. The first conductive material layers are formed within each of the openings of the substrate. The first conductive material layers substantially have a round top surface. The second conductive material layers are formed and substantially conformal over the first conductive material layers. The second conductive material layers cover a major portion of the round top surface of the first conductive material layers.

In accordance with some exemplary embodiments, a method of forming a space transformer (ST) substrate comprises the following steps. A plurality of first conductive material layers are formed within each of a plurality of openings of a substrate. The first conductive material layers substantially have a round top surface. A plurality of second conductive material layers are formed and substantially conformal over the first conductive material layers. The second conductive material layers cover a major portion of the round top surface of the first conductive material layers.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

Figure 1:
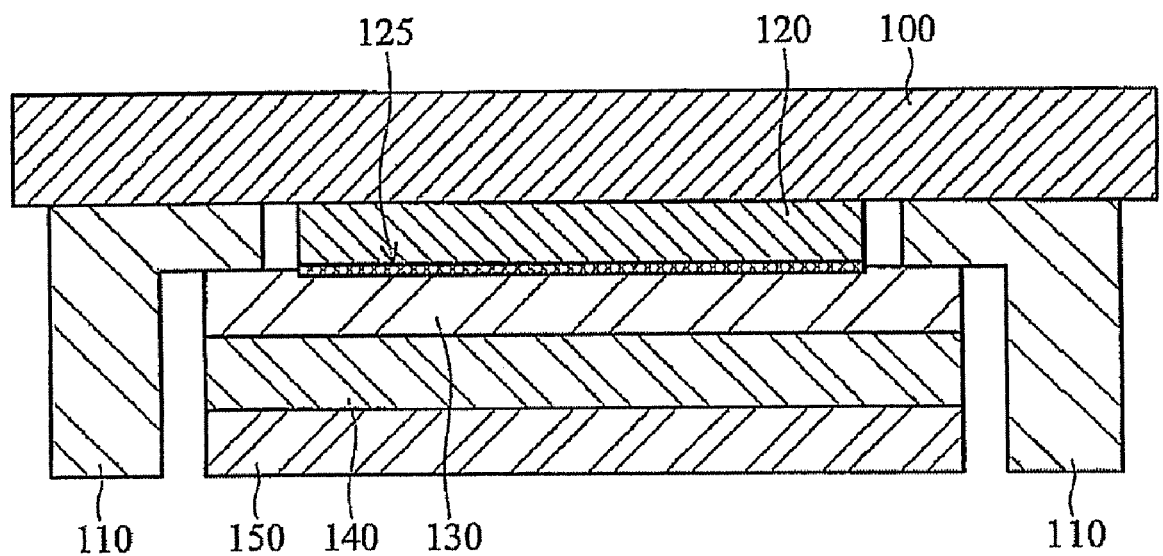
FIG. 1 is a schematic cross-sectional view of a probe card attached to a test apparatus.
Figure 2:
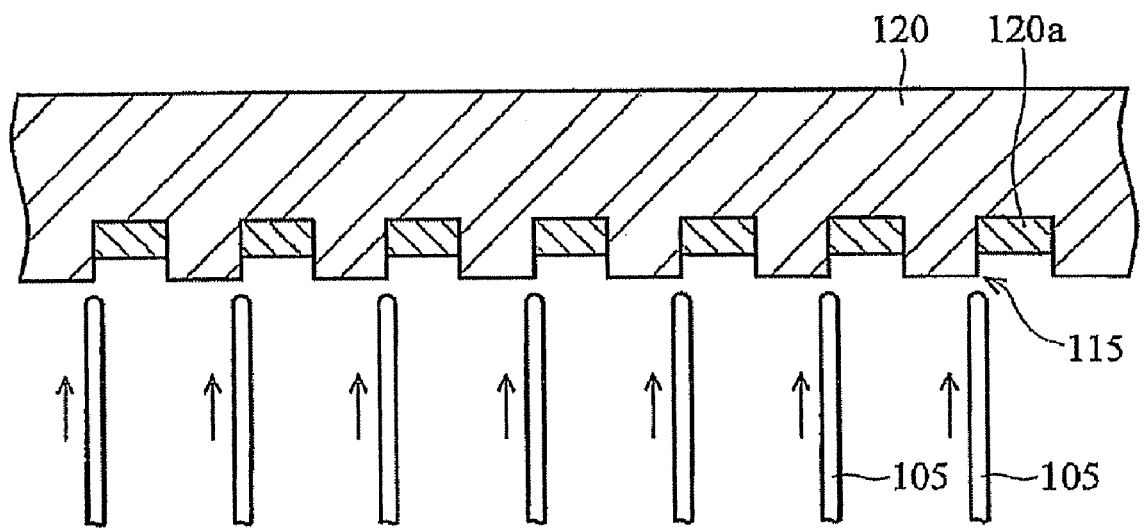
FIG. 2 is a cross-sectional view of a prior art space transformer.

This description of the exemplary embodiments is intended to be read in connection with the accompanying drawings, which are to be considered part of the entire written description. In the description, relative terms such as "lower,"

"upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 3A:
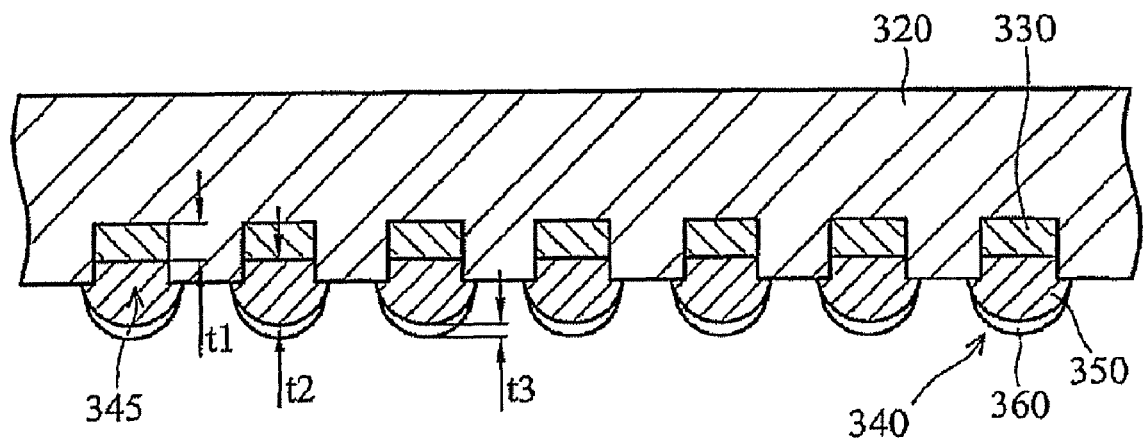
FIG. 3A is a schematic cross-sectional view of an exemplary space transformer.

FIG. 3A is a schematic cross-sectional view of an exemplary space transformer.

The space transformer 320 comprises a plurality of openings 345 formed therein. The conductive layers 330 are formed within the openings 345. The first conductive material layers 350 are formed in each of the openings 345. The second conductive material layers 360 are over the first conductive material layers 350. The The space transformer 320 can be, for example, a silicon substrate, a III-V compound substrate, a glass substrate, a printed circuit board (PCB) or any other substrate similar thereto. In addition, the substrate may comprise various semiconductor structures, such as input/output trace routings, interposers and power/ground planes with power/ground routings (not shown), thereon to provide desired test structure.

The openings 345 are arranged in a line configuration, an array configuration or other desired test configurations. The openings 345 can be formed by an etch process or other methods which are adapted to form the openings 345.

The conductive layers 330 are formed within the openings 345. The conductive layers 330 connect the semiconductor structures (not shown) within the space transformer 320 with the pad structures 340 described below. The conductive layers 330 can be made of, for example, copper (Cu), aluminum (Al), nickel (Ni), Al/Cu, titanium (Ti), Tantalum (Ta) or other materials which are adapted to serve as connections of the pad structures 340. The conductive layers 330 can be formed by, for example, Chemical Vapor Deposition (CVD), Physical Vapor Deposition (PVD), Atomic Layer Deposition (ALD), electrical plating methods, electroless chemical plating methods, molding methods, or other methods which form the conductive layers 330 within the openings 345. In this preferred embodiment, the conductive layers 330 are Cu layers having thickness "t1" of about 20 μm. In some embodiments, the conductive layers 330, however, can be omitted, if the elimination of the conductive layers 330 does not affect formation of subsequent layers or electrical performance of the space transformer 320.

The first conductive material layers 350 are formed within the openings 345 and over the conductive layers 330. The first conductive material layers 350 can be made of, for example, gold (Au), nickel (Ni), copper (Cu), chromium (Cr), platinum (Pt), cobalt (Co), manganese (Mn), palladium (Pd), ruthenium (Rh), (tungsten) W or other conductive materials or alloys thereof. In one preferred embodiment, the first conductive material layers 350 are made of a Ni—Co alloy with Co concentration of about 3 w. %. In addition, the first conductive material layers 350 have a thickness "t2" of about 18 μm. The first conductive material layers 350 have hardness of at least about 200 kg/mm$^2$. The first conductive material layers 350 can be formed, for example, by CVD, PVD, ALD, electrical plating methods, electroless chemical plating methods, molding methods, or other methods which are adapted to form the first conductive material layers 350. In this embodiment, the first conductive material layers 350 are formed by a chemical-electrical plating method. Detailed descriptions of the chemical-electrical plating method are provided below.

The first conductive material layers 350 may have a round top surface, a flat top surface, a semi-spherical surface or a top surface having another shape. In the exemplary embodiment of FIG. 3A, the first conductive material layers 350 have a round top surface. The first conductive material layers 350 are formed below, substantially as high as, or over the surface of the space transformer 320. In the exemplary embodiment of FIG. 3A, the first conductive material layers 350 are formed over the surface of the space transformer 320 so that the likelihood of contact between pins of the guide plate (not shown) and the surface of the space transformer 320 is reduced. However, the contact between pins of the guide plate and the surface of the space transformer 320 is not a concern if misalignment of the guide plate and the space transformer 320 is not worse than a threshold amount. The first conductive material layers 350 need not cover the surface of the space transformer 320. One skilled in the art can readily understand whether to form the first conductive material layers 350 over the surface of the space transformer 320 depending on the misalignment of the guide plate and the space transformer 320.

The second conductive material layers 360 are formed over the first conductive material layers 350. The second conductive material layers 360 can be made of, for example, gold (Au), nickel (Ni), copper (Cu), chromium (Cr), platinum (Pt), cobalt (Co), manganese (Mn), palladium (Pd), ruthenium (Rh), (tungsten) W or other conductive materials or alloys thereof. In this preferred embodiment, the second conductive material layers 360 are made of an Au—Co alloy having a Co concentration of about 1 w. %. In addition, the second conductive material layers 360 have a thickness "t3" of about 2 μm. The second conductive material layers 360 have hardness over about 80 kg/mm$^2$. Compared with the first conductive material layers 350, the second conductive material layers 360 of some embodiments have a lower hardness. The second conductive material layers 360 can be formed, for example, by CVD, PVD, ALD, chemical-electrical plating methods, electroless chemical plating methods, molding methods, or other methods which are adapted to form the second conductive material layers 360. In this embodiment, the second conductive material layers 360 are formed by an electrical plating method. Detailed descriptions of the chemical-electrical plating method are provided later.

In some embodiments, the second conductive material layers 360 provide desired contact characteristics between the pins of guide plate (not shown) and the first conductive material layers 350. The second conductive material layers 360 may also provide desired wear-out characteristics for testing. The expected lifetime of the second conductive material layers 360 can be, for example, more than 500,000 touchdowns between the second conductive material layers 360 and pins (not shown). In some embodiments, the second conductive material layers 360 have an expected lifetime higher than that of the first conductive material layers 350.

Figure 3B:
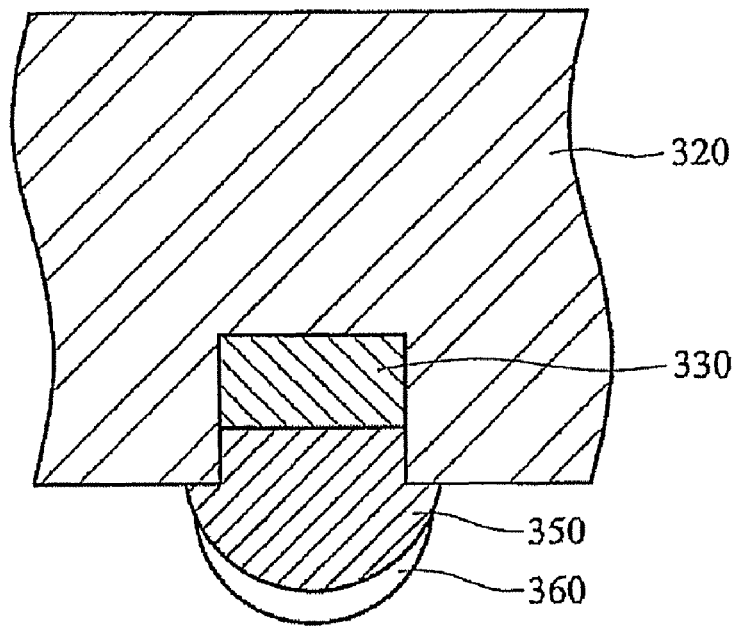
FIG. 3B is a schematic cross-sectional view showing a magnified pad structure.

The second conductive material layers 360 are formed over the first conductive material layers 350. In some embodiments, second conductive material layers 360 conform to the shape of the first conductive material layers 350. Because the shape of the first conductive material layers 350 varies as set forth above, the second conductive material layers 360 are formed corresponding thereto. In the exemplary embodiment of FIG. 3A, the second conductive material layers 360 conform to the round top surface of the first conductive material layers 350. In addition, the second conductive material layers 360 also covers the entire round top surface of the first conductive material layers 350. FIG. 3B is a schematic cross-sectional view showing a magnified pad structure. In some embodiments (as shown in FIG. 3B), the second conductive material layer 360 covers a major portion of the round top surface of the first conductive material layer 350. The second conductive material is deposited at least over a sufficient area so that substantially all of the pins of the guide plate are expected to contact the second metal, even allowing for some small misalignment. If the misalignment of the substrate 320 and the guide plate (not show) is well controlled, pins of the guide plate will mostly contact the central portion of the first conductive material layers 350. Because covering the central portion of the first conductive layers 350, the second conductive material layers 360 provide the desired wear-out characteristics and protect the first conductive material layers 350 therebelow. The characteristics, such as thicknesses or concentrations of alloys, of the conductive layers 330, the first conductive material layers 340 and the second conductive material layers 350 are adjustable. Upon the descriptions in connection with these exemplary embodiments, one skilled in the art can readily understand how to select the characteristics of the conductive layers 330, the first conductive material layers 350 and the second conductive material layers 360 to obtain a desired pad structure.

Figure 4:
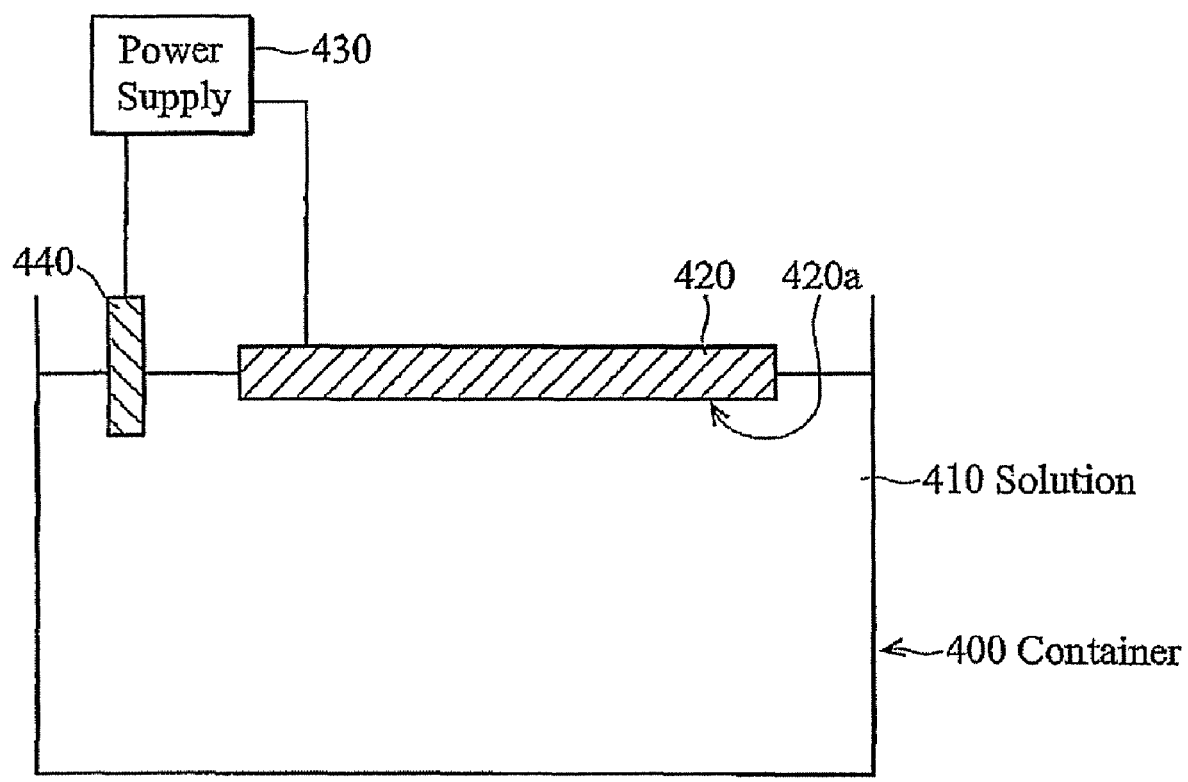
FIG. 4 is a schematic drawing showing an exemplary method of forming pad structures on a space transformer.

FIG. 4 is a schematic drawing showing an exemplary method of forming pad structures on a space transformer.

Referring to FIG. 4, the container 400 has the solution 400 therein. The power supply 430 is coupled to the electrode 440 and the space transformer 420, which are disposed within the solution 410 of the container 400. A desired conductive material layer is then formed on the surface 420a of the space transformer 420.

The solution 410 contains ions of the material to-be-deposited to form a conductive material layer. For example, if Ni is to be electroplated on the surface 420a of the space transformer 420, the solution 410 with $Ni^{2+}$ ions is used. Accordingly, if materials, such as Au, Ni, Cu, Cr, Pt, Co, Mn, Pd, Rh or W are to be formed on the surface 420a, a solution with ions corresponding thereto should be used.

In some embodiments, the first conductive material layers 350 of FIG. 3 are made of a Ni—Co alloy. The solution 410 comprises a solution with nickel and cobalt ions. For example, nickel ions can be provided by adding nickel sulfate, nickel nitrate, nickel chloride, nickel carbonate or other nickel salts in the solution 410. Cobalt ions can be provided by adding cobaltous acetate, cobaltous sulfate, sobaltous chloride, cobaltous nitrate, cobaltous cablnate, cobaltous fluoride or other cobaltous salts. In some embodiments, the solution 410 comprises nickel sulfamate such as $Ni(H_2SO_3)_2$, $Ni(SO_3NH_2)_2$, $Ni(SO_3NH_2)_2.4H_2O$ or other nickel sulfamate. The solution 410 also comprises cobalt sulfamate such as $Co(H_2NSO_3)_2$.

In an exemplary embodiment, the solution 410 comprises nickel sulfamate $(Ni(H_2SO_3)_2)$, cobalt sulfamate $Co(H_2NSO_3)_2$ and boric acid $(H_3BO_3)$ to electroplate the first conductive material layers 350 of Ni—Co alloy. The concentration of nickel sulfamate in the solution 410 is from about 300 g/l to about 500 g/l. The concentration of cobalt sulfamate in the solution 410 is from about 75 g/l to about 150 g/l. The concentration of boric acid in the solution 410 is from about 20 g/l to about 40 g/l. The pH value of the solution 410 with the Ni—Co sulfamate is from about 3.5 to about 4.5. The temperature of the solution 410 with the Ni—Co sulfamate is from about 50° C. to about 60° C. The current density of the electroplating process is from about 5 A/m² to about 50 A/m². Upon reading the description of these embodiments, one skilled in the art can readily select an appropriate method of forming the first conductive material layers 350 shown in FIG. 3A to form the desired structures.

To electroplate the second conductive material layers 360, the solution 410 should have ions of the material of the second conductive material layers 360. Accordingly, if materials, such as Au, Ni, Cu, Cr, Pt, Co, Mn, Pd, Rh or W are to be formed on the surface 420a, a solution with ions corresponding thereto should be used. In some embodiments, the second conductive material layer 360 comprises an Au—Co alloy. The solution 410 for depositing the Au—Co alloy thus should comprise ions of Au and Co.

In an exemplary embodiment, the second conductive material layers 360 of FIG. 3A are made of an Au—Co alloy. The solution 410 thus comprises a solution with gold and cobalt ions. For example, the solution 410 comprises gold potassium cyanide, gold sulfite or other solutions with gold. Cobalt ions can be provided by adding cobaltous acetate, cobaltous sulfate, sobaltous chloride, cobaltous nitrate, cobaltous cablnate, cobaltous fluoride or other cobaltous salts.

In a preferred embodiment, the solution 410 comprises gold potassium cyanide $KAu(CN)_2$, cobalt sulfate heptahydrate $(CoSO_4.7H_2O)$, critic acid $(H_3.C_6HO_7.7H_2O)$ and sodium citrate $(Na_3.C_6H_5O_7.7H_2O)$. The concentration of gold potassium cyanide in solution 410 is from about 10 g/l to about 40 g/l. The concentration of cobalt sulfate heptahydrate in solution 410 is from about 40 g/l to about 200 g/l. The concentration of critic acid in solution 410 is from about 60 g/l to about 120 g/l. The concentration of sodium citrate in solution 410 is from about 150 g/l to about 300 g/l. The pH value of the solution 410 for Au—Co electroplating is from about 3.0 to about 4.5. The temperature of the solution 410 is from about 30° C. to about 50° C. The current density of the electroplating process is from about 1 A/m² to about 30 A/m². The descriptions of the electroplating methods set forth above are merely exemplary embodiments. The present invention, however, is not limited thereto. One skilled in the art can readily modify these conditions or characteristics to form a desired pad structure.

Though the first conductive material layers 350 and the second material layers 360 can be formed by the electrical plating methods, this is merely an exemplary method of forming the pad structures 340. As set forth above, the pad structures 340 can be formed by electroless plating methods, CVD, PVD, ALD, molding methods or other deposition methods. Furthermore, the methods of forming the first conductive material layers 350 and the second conductive material layers 360 can be the same as, or different from, each other. One skilled in the art can readily adapt different methods set forth above to form desired pad structures.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A space transformer (ST) substrate, comprising:
   a substrate having two major faces with a plurality of openings in a single one of the two major faces, each opening partially filled with a conductive layer at the bottom thereof;
   a respective first conductive material layers in each of the openings, the first conductive material layers filling a remainder of each of the plurality of openings and having a substantially round top surface, the top surface having a diameter that is greater than a width of the openings at a top of the openings, wherein the substrate is formed from a single piece of material that includes a respective bottom wall in each opening contacting a bottom surface of the conductive layer in each respective opening, and the substrate includes respective side walls in each opening that contact side walls of the conductive layer and sides of the first conductive material layer in each respective opening, the side walls extending up to the top of each opening; and a plurality of second conductive material layers substantially conformal over the first conductive material layers, covering a major portion of the round top surface of the first conductive material layers.

2. The ST substrate of claim 1, wherein the first conductive material layers have a first hardness over about 200 kg/mm$^2$, and the second conductive material layers have a second hardness over about 80 kg/mm$^2$.

3. The ST substrate of claim 1, wherein each of the first conductive material layers and the second conductive material layers is selected at least one from the group consisting of gold (Au), nickel (Ni), copper (Cu), chromium (Cr), platinum (Pt), cobalt (Co), manganese (Mn), palladium (Pd), ruthenium (Rh), (tungsten) W and alloy thereof.

4. The ST substrate of claim 1, wherein the first conductive material layer is a Ni—Co alloy and the second conductive material layer is an Au—Co alloy.

5. The ST substrate of claim 4, wherein the Ni—Co alloy has a Co concentration of about 3 w. %, and the Au—Co alloy has a Co concentration of about 1 w. %.

6. The ST substrate of claim 4, wherein the Ni—Co alloy has a thickness of about 18 μm and the Au—Co alloy has a thickness of about 2 μm.

7. The pad structure of claim 1, wherein an expected lifetime of the second conductive material layer is longer than an expected lifetime of the first conductive material layer.

8. The ST substrate of claim 4, wherein the Ni—Co alloy has a thickness of about 18 μm and a Co concentration of about 3 w. %, and the Au—Co alloy has a thickness of about 2 μm and a Co concentration of about 1 w. %.

9. The ST substrate of claim 1, wherein the second conductive material layers each cover a portion of the round top surface of the first conductive material layers, the covered portion having a diameter that is greater than the width of the openings at a top of the openings.

10. The ST substrate of claim 9, wherein the first and second conductive material layers have a diameter that is greater than a width of the conductive layer at the bottom of each opening.

11. The ST substrate of claim 1, wherein the substrate is a silicon substrate.

12. The ST substrate of claim 1, wherein the substrate is a III-V compound substrate.

13. The ST substrate of claim 1, wherein the substrate is a glass substrate.

14. The ST substrate of claim 1, wherein the walls of the openings are perpendicular to the top surface of the substrate.

15. A space transformer (ST) substrate, comprising:
a substrate having two major faces with a plurality of openings in a single one of the two major faces, each opening partially filled with a conductive layer at the bottom thereof, each opening having a constant width from a top of the opening to a bottom of the conductive layer;

a plurality of first conductive material layers in each of the openings, the first conductive material layers filling a remainder of each of the plurality of openings and having a substantially round top surface, the top surface having a diameter that is greater than the width of the openings; and a plurality of second conductive material layers substantially conformal over the first conductive material layers, covering a major portion of the round top surface of the first conductive material layers.

16. The ST substrate of claim 15, wherein the substrate is formed from a single piece of material that contains the conductive layers and has walls around the sides of the first material layers extending up to the top of each opening.

* * * * *